United States Patent
Thwaite

(10) Patent No.: US 6,914,841 B1
(45) Date of Patent: Jul. 5, 2005

(54) SYSTEM AND METHOD FOR REFRESHING A DYNAMIC MEMORY DEVICE

(75) Inventor: Peter Thwaite, Burlington, VT (US)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/768,202

(22) Filed: Jan. 30, 2004

(51) Int. Cl.[7] .................................................. G11C 7/00
(52) U.S. Cl. ........................ 365/222; 365/203; 365/233
(58) Field of Search ................................. 365/222, 203, 365/205, 230.06, 233

(56) References Cited

U.S. PATENT DOCUMENTS

| | | | |
|---|---|---|---|
| 4,796,232 A | * | 1/1989 | House .................. 365/189.03 |
| 4,943,960 A | | 7/1990 | Komatsu et al. |
| 5,995,434 A | | 11/1999 | Ryu |
| 6,333,883 B2 | * | 12/2001 | Wakayama et al. ......... 365/205 |
| 6,363,024 B1 | | 3/2002 | Fibranz |
| 6,529,433 B2 | * | 3/2003 | Choi .......................... 365/222 |
| 6,567,332 B2 | | 5/2003 | Sawhney |
| 6,625,077 B2 | | 9/2003 | Chen |
| 6,643,205 B2 | | 11/2003 | Kim |
| 6,661,732 B2 | | 12/2003 | Sunaga |
| 2004/0059840 A1 | * | 3/2004 | Perego et al. .................. 710/6 |

* cited by examiner

*Primary Examiner*—Gene N. Auduong
(74) *Attorney, Agent, or Firm*—Slater & Matsil, L.L.P.

(57) ABSTRACT

A memory device (10) includes an array (12) of memory cells arranged in rows and columns. Preferably, each memory cell includes a pass transistor coupled to a storage capacitor. A row decoder (18) is coupled to rows of memory cells while a column decoder (14) is coupled to columns of the memory cells. A refresh controller (19) is adapted to generate memory cell addresses for array (12) during a refresh sequence. In a preferred embodiment of the present invention, the refresh controller ensures that no shared sense amplifiers (24) are activated during consecutive refresh cycles, allowing a portion or all of the time required for precharging the bitlines to be saved. In a preferred embodiment, consecutive refresh cycles can be located closer together in time because a second refresh cycle may be initiated prior to the completion of a first refresh cycle.

23 Claims, 5 Drawing Sheets

SYSTEM AND METHOD FOR REFRESHING A DYNAMIC MEMORY DEVICE

TECHNICAL FIELD

The present invention relates generally to the fabrication of semiconductor memory devices, and more particularly to a system and method for performing a refresh of dynamic memory devices.

BACKGROUND

Semiconductor devices are used for integrated circuits in a variety of electrical and electronic applications, such as computers, cellular telephones, radios, and televisions. One particular type of semiconductor device is a semiconductor storage device, such as a random access memory (RAM) device. Many RAM devices include many storage cells arranged in a two-dimensional array with two sets of select lines, wordlines and bitlines. An individual storage cell is selected by activating its wordline and its bitline. RAM devices are considered "random access" because any memory cell in an array can be accessed directly if the row and column that intersect at that cell are known.

A commonly used form of RAM is known as a dynamic RAM device. Dynamic random access memory (DRAM) has memory cells with a paired transistor and capacitor. DRAM devices store information as an electrical charge in the capacitor. One particular type of DRAM device is a synchronous DRAM (SDRAM) device. Synchronous dynamic random access memory often takes advantage of the burst mode concept to greatly improve performance by staying on the row containing the requested bit and moving rapidly through the columns. To achieve a high speed operation, a double data rate (DDR) architecture is often used, during which two data transfers are made per clock cycle, one upon the rising edge of the clock and the other upon the falling edge.

An individual memory cell for a DRAM usually comprises a capacitor of MOS structure for storing a charge representing the desired data. This stored charge tends to dissipate over time due to charge leakage from the capacitor. In order to prevent the stored data-bearing charge from being lost, it is known that the memory cells of DRAMs have to be regularly read and then have their contents rewritten, which is referred to as a "refresh" of the memory cells. Each of the memory cells in a DRAM device must be periodically refreshed in this manner, wherein the maximum refresh period is determined by a variety of process parameters and is defined by the device manufacturer typically in accordance with predetermined standards.

Practical DRAM devices may have on chip control logic for automatically carrying out an externally or internally generated refresh command. The on chip refresh logic would make the refresh process transparent to the user by inputting a refresh command from, for example, a memory controller, and internally carrying out all the logical steps necessary to refresh some or all of the memory cells in the allotted time period, including address generation, wordline and bitline activation, and returning the chip to a precharge state.

The requirement to refresh a DRAM is integral to the MOS-capacitor structure of the individual memory cells, and this refresh operation takes some time to perform. The refresh operation reduces the overall throughput of the DRAM, as the DRAM is typically unavailable for data read and write operations during refresh. It is therefore advantageous to minimize the amount of time that must be spent refreshing the memory cells, as the refresh time represents a dead time in the operation of the memory device.

There are a variety of circuits, systems, and methods for refreshing DRAM devices known in the art. Among these are U.S. Pat. No. 6,643,205, "Apparatus and method for refresh and data input device in SRAM having storage capacitor cell", issued to Kim; U.S. Pat. No. 6,625,077, "Asynchronous hidden refresh of semiconductor memory", issued to Chen; U.S. Pat. No. 4,943,960, "Self-refreshing of dynamic random access memory device and operating method therefore", issued to Komatsu, et al.; U.S. Pat. No. 6,363,024, "Method for carrying out auto refresh sequences on a DRAM", issued to Fibranz; U.S. Pat. No. 5,995,434, "Dynamic random access memory device having a self-refresh mode", issued to Ryu; U.S. Pat. No. 6,567,332, "Memory device with reduced power consumption refresh cycles", issued to Sawhney; and U.S. Pat. No. 6,661,732, "Memory system having reduced powder data refresh" issued to Sunaga. All of the above listed patents are incorporated herein by reference in their entirety.

SUMMARY OF THE INVENTION

Embodiments of the present invention achieve technical advantages as a system and method for controlling wordline addressing during refresh thereby allowing subsequent refresh cycles to be initiated prior to the completion of a first refresh cycle, thus optimizing device speed.

In accordance with a preferred embodiment of the present invention, a system and method for ensuring that no shared sense amplifiers are activated during consecutive refresh cycles allows a portion or all of the time required for precharging the bitlines to be saved.

An advantage of a preferred embodiment of the present invention is that consecutive refresh cycles can be located closer together in time because a second refresh cycle may be initiated prior to the completion of a first refresh cycle.

A further advantage of a preferred embodiment of the present invention is that consecutive refresh cycles can be located closer together in time because a second refresh cycle may be initiated during the precharge interval of a first refresh cycle.

A further advantage of a preferred embodiment of the present invention is that consecutive refresh cycles can be located closer together in time because a second refresh cycle may be initiated during the activation interval of a first refresh cycle.

In accordance with another preferred embodiment of the present invention, a system and method for reducing the peak power consumption during refresh allows for the acceleration of the refresh process, thereby increasing the bandwidth of the memory device by reducing the deadtime associated with the refresh process.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

DRAM device architecture and design implementation issues will first be discussed, followed by a description of preferred embodiments of the present invention and a discussion of some advantages thereof. Although each figure shows certain elements for purposes of discussion, many other components of a memory device may be present in the semiconductor devices shown.

Figure 1:
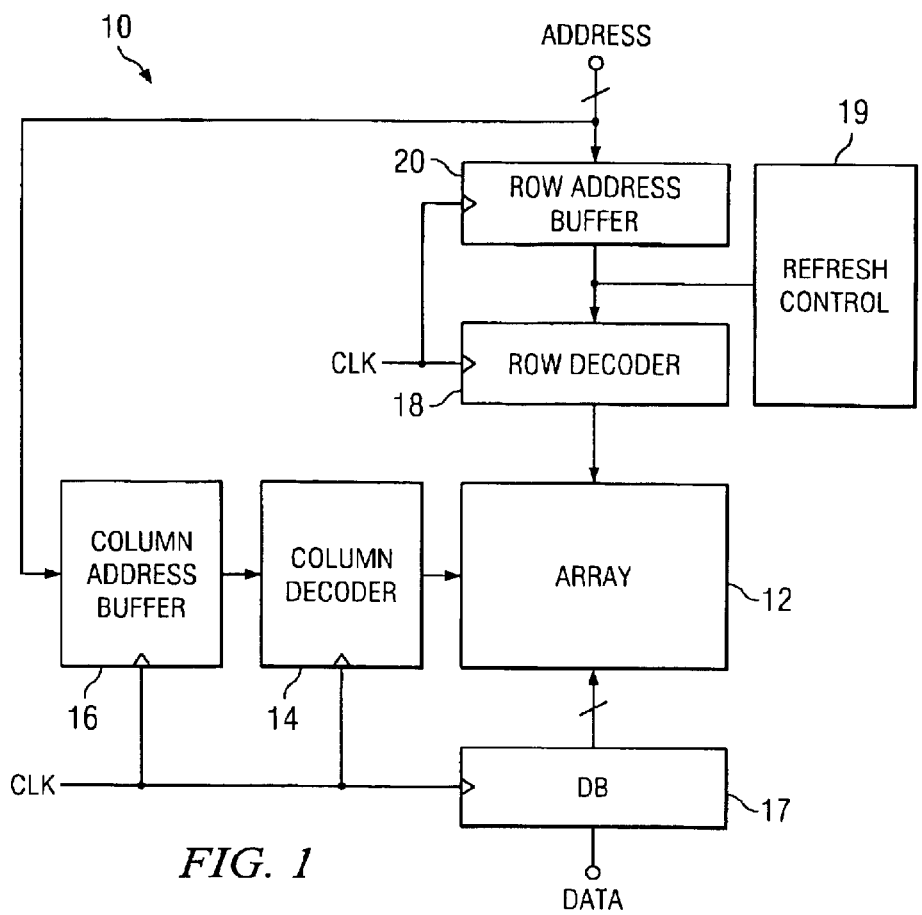
FIG. 1 illustrates a block diagram of a DRAM device.

FIG. 1 illustrates a functional block diagram of a DRAM device 10. To access a particular cell in the array 12, an address selection signal ADDR is transmitted to a Column Address Buffer (CAB) 16 and Row Address Buffer (RAB) 20. In a typical DRAM chip, the column address and row address share external pins so that the row address is received at a first time and the column address is received at a second time. The ADDR signals may be transmitted by an external device, such as a memory controller (not shown), for example.

The column address buffer 16 and row address buffer 20 are adapted to buffer the address signal. The outputs of the column address buffer 16 and row address buffer 20 are coupled to a column decoder 14 and row decoder 18, respectively. The column and row decoders 14 and 18 are adapted to decode the signals received from the column address buffer 16 and row address buffer 20, respectively, to provide the signal input to the array 12 such that the selected row and column can be selected.

In FIG. 1, the decoders 14 and 18 are shown as single blocks. It should be understood, however, that the decoders may carry out several levels of predecoding and decoding. Some, all, or none of these levels may be clocked.

Data t hat is addressed in memory 10 will be written into array 12 or read from array 12 via data buffer (DB) 17. Once a gain, this portion of FIG. 1 is simplified. The data buffer 17 and the associated line are provided to represent the read and write path, which may include a large number of lines and other components (e.g., secondary sense amplifiers).

FIG. 1 also shows a clock input CLK to illustrate that the memory device could be synchronous. To further illustrate this point the clock signal CLK is provided to each of the blocks. It is understood that while the external clock could be provided to various elements in the array, a number of clocking signals, which may operate continuously or only when needed, may be derived from the clock.

Also shown in FIG. 1 is refresh control block 19, which is used to facilitate the refresh of the memory cells in array 12. The refresh control block 19 typically contains some form of address generation, often a digital counter. Additionally, the refresh control block 19 may accept an auto refresh command input signal (not shown) from an external processor or memory controller, or it may internally determine the appropriate time to perform a refresh. The function of auto refresh block 19 is to automatically generate the addresses of the memory cells to be refreshed, and to carry out all of the logical steps necessary to perform the refresh. It may be advantageous to refresh the memory cells on more than one wordline at a time. In a preferred embodiment shown in FIG. 1, the address generated by block 19 is only applied to row decoder 18. Certain portions (or all) of block 19 may be part of DRAM device 10. Conversely, some or all of block 19 may reside external to DRAM device 10.

Figure 2:
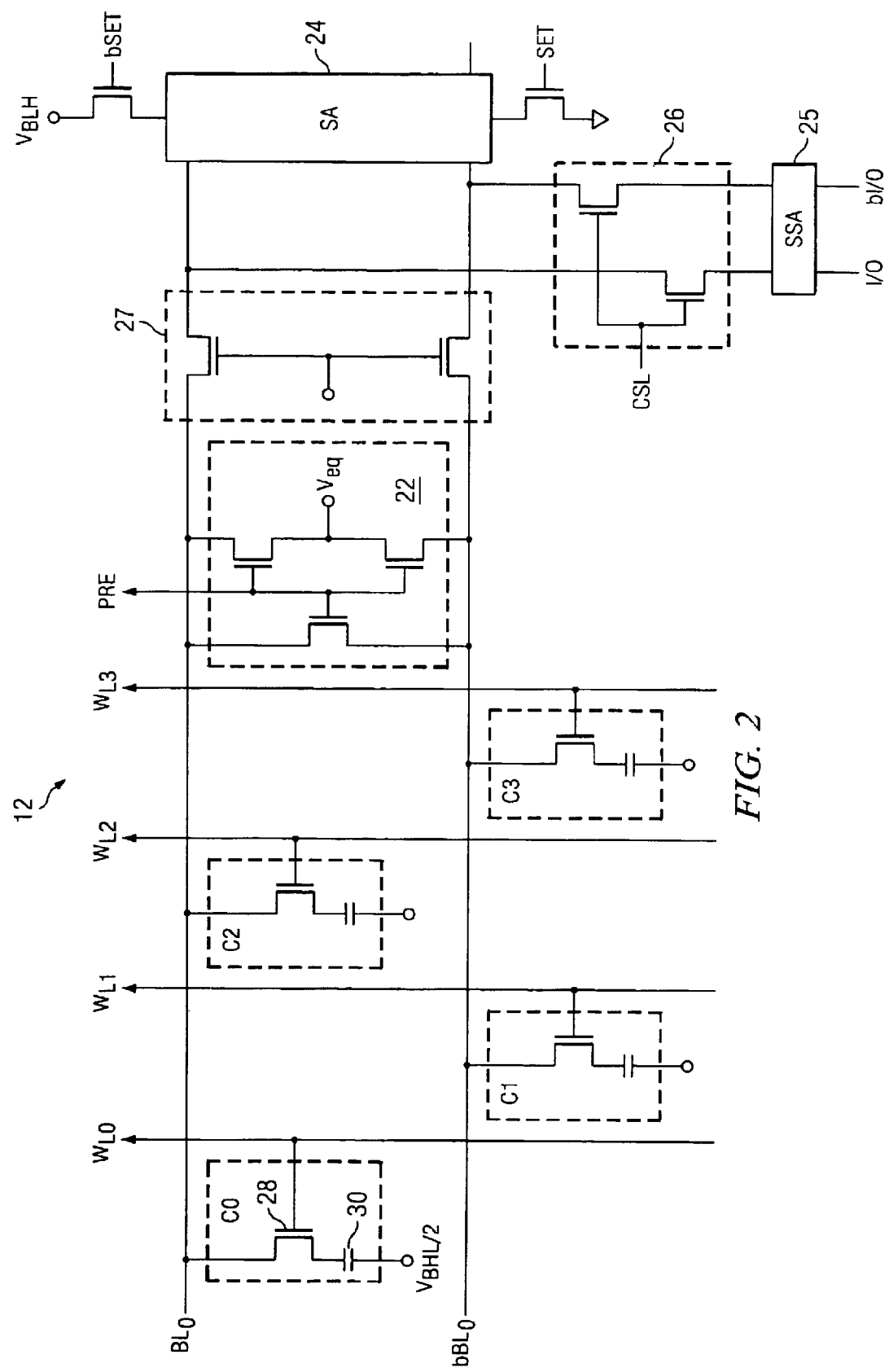
FIG. 2 illustrates an array portion of a DRAM device.

FIG. 2 shows more detail of the memory array 12. As shown in FIG. 2, the memory array 12 includes a plurality of memory cells arranged in a matrix-type architecture or array. Each cell $C_0$, $C_1$, $C_2$, $C_3$ includes an access transistor 28, typically an n-channel metal oxide semiconductor field effect transistor (MOSFET), coupled in series with a capacitor 30. The gate of each access transistor 28 is coupled to a wordline $WL_0$, and one source/drain region of the transistor 28 is coupled to a bitline $BL_0$, as shown. A second source/drain region of the transistor 28 is coupled to one end of the storage capacitor 30. The other end of the storage capacitor 30 is coupled to a reference voltage, such as half of the bitline high voltage ($V_{BLH}/2$), for example. The simplified example of FIG. 2 shows only four memory cells. It is readily understood that a practical DRAM device may contain a plurality of cells, perhaps many millions or even billions of memory cells arranged in an array of rows and columns.

In the folded bitline embodiment the bitlines are organized as bitline pairs, e.g., $BL_0$ and $bBL_0$. Each bitline pair $BL_0/bBL_0$ is coupled to a sense amplifier 24, which is configured to amplify the voltage difference between the two bitlines in a pair. Traditional mid-level sensing is accomplished using latch-type sense amplifiers with a bitline high level of 1.5 V, for example. Equalization and pre-charge circuitry 22 is also coupled between each bitline in a pair to provide the proper initial voltages on the bitlines.

In a particular embodiment, the DRAM device 10 includes four 128 Mb memory quadrants, each of which corresponds to an individual logical bank. A memory array with 1 Gbit or greater capacity might include eight or sixteen banks. Each 128 Mb bank may be physically separated into a number of blocks, e.g., 16 blocks, each with 8 Mb in a folded bitline configuration. There may be 512 bits for each bitline. A block may comprise 1024 wordlines. The blocks may be separated by stripes of 4k sense amplifiers on the right and left sides, which are shared by neighboring blocks. Each block is divided into eight sections, called column segments, each of which has its own local data lines (LDQ).

The high voltage on the wordline will cause the access transistor of each memory cell coupled to that wordline to be conductive. Accordingly, charge will travel either to the bitline from the memory cell (in the case of a physical one, e.g., $V_{BLH}$) or from the bitline to the memory cell (in the case of a physical zero, e.g., 0V). The sense amplifier 24, when activated by signal SET, will sense the physical one or zero and generate a differential voltage that corresponds with the signal read from the cell.

The present invention contemplates many architectures. For example, it is possible to have a single "master" wordline which activates many local wordlines. In this case, more than one physical wordline can correspond to the same logical address A pair of pass transistors 26 is provided between each column and the local data lines LDQ and bLDQ. Since the sense amplifier 24 associated with each column will generate a bit that corresponds to a cell associated with the selected row (as determined by the selected wordline), a column select signal CSL is provided to the pass transistors 26 to select one of the columns, which is coupled to the LDQ. Of course, some architectures will include multiple I/O's in which case a single select signal CSL is coupled to the pass transistors of more than one column. In fact there are several possibilities, single CSL to multiple columns, multiple CSLs to single columns or multiple CSLs to multiple columns.

An additional pair of pass transistors 27 are provided to isolate the sense amplifier (SA) 24 from bitlines $BL_0$ and $bBL_0$. By using pass transistors 27, the sense amplifier 24 can be shared by multiple bitlines, thus reducing the total number of sense amplifiers required for the DRAM device. For example, another pair of pass transistors 27 could be located to the right of SA 24 on FIG. 2 (not shown, see FIG. 5).

A secondary sense amplifier (SSA) 25 is coupled to each I/O line to amplify the voltage level and drive the signal across the chip. The SSA 25 is timed off of the logic which enabled the CSL. In a preferred embodiment, this circuitry contains not only a sense amplifier for reading but also write buffers for driving the I/O lines. Basically the "SSA" can be in one of three states: precharged (if no read or write), reading, or writing.

When a read command is issued, the CSLs get activated, and the primary sense amplifiers are connected to the I/O lines, which form the inputs of the secondary sense amplifiers. The SSAs amplify and redrive this signal into the spine of the chip from where it is passed to the I/O pads.

A write cycle will be performed in a similar fashion as a read. First, a wordline must have been previously activated, e.g., a bank is active. Subsequently, data is placed on the I/O lines and the CSLs are activated. During a write cycle, the secondary sense amplifier is not connected to the I/O lines but the write drivers are connected instead. They overwrite the primary sense amplifier, causing the BL and bBL to change (only in the case of a different data state) and the data is transferred to the memory cell.

To be compliant with international standards for reading or writing data in or out of SDRAM devices, a sequence of timings must be met. For example, the majority of DRAMs sold today comply with the standards set by JEDEC (once known as the Joint Electron Device Engineering Council). See e.g., JEDEC Double Data Rate (DDR) SDRAM Specifications JESD79, DDR3332.5-3.3 and DDR 266 2-2-2, which are incorporated herein by reference.

In addition to read and write cycles, a DRAM device must refresh each of its memory cells within a specified time period, or the data may be lost. The requirement to refresh a DRAM is integral to the MOS-capacitor structure of the individual memory cells, as the stored charge tends to dissipate over time due to charge leakage from the capacitor. Each of the cells must be read and then written back in order to restore, or refresh, the data bearing charge before the charge dissipates too much to be reliably read. The rate at which this charge dissipation occurs is controlled by various manufacturing and process parameters, therefore the maximum allowable time between refresh cycles is typically specified by the manufacturer in accordance with defined standards.

The refresh operation takes place when the memory device is idle, i.e., there are no data read or write operations being performed, or when the memory controller determines that the maximum allowable refresh period is about to expire. Below are discussed three exemplary modes of refreshing a DRAM device that can utilize concepts of the present invention. During a self refresh, a single command is issued to the DRAM, and an internal refresh controller refreshes all of the memory cells in sequence (keeping in mind that a plurality of cells can be refreshed simultaneously). During an auto refresh, the internal refresh controller automatically generates the row addresses and refreshes each row upon receipt of a command from the external memory controller.

Auto refresh may be executed in two modes: distributed mode or burst mode. In distributed mode the refresh controller will refresh one or more rows in sequence, but not the entire device at once. The memory controller keeps track of the time elapsed since the last refresh of each cell (or bank of cells), and can thus cycle through the entire DRAM device within the maximum refresh period by performing multiple refresh steps. In burst refresh mode the memory controller provides a series of refresh commands sufficient to refresh the entire chip. The present invention can be used with each of these modes.

Figure 3:
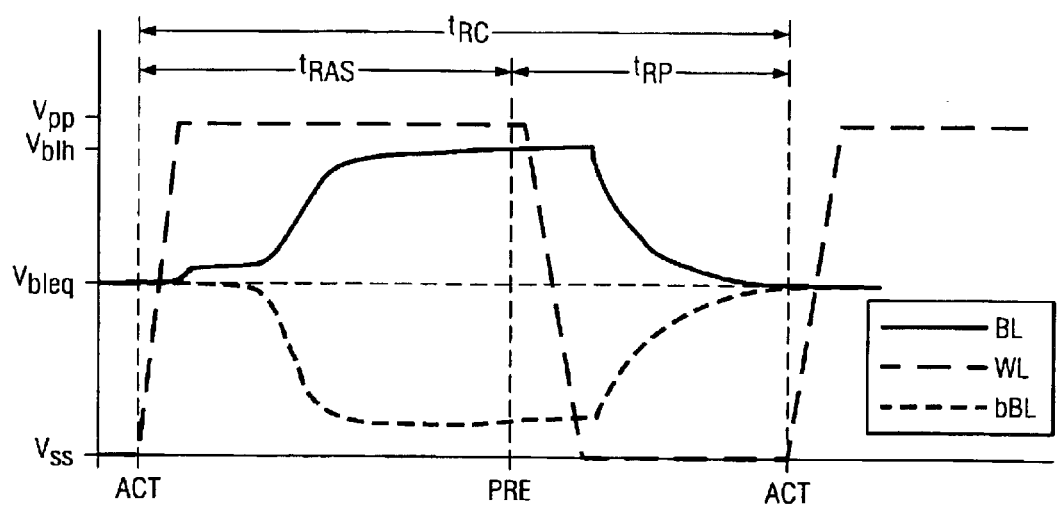
FIG. 3 shows a timing diagram for a refresh cycle of a DRAM device.

Details of a typical refresh cycle are illustrated in FIG. 3. Shown are simplified waveforms corresponding to the signal level on a selected wordline (WL), and a selected bitline pair (BL and bBL). An activate command (ACT) is the command that controls the wordline activation, commanding WL to go high in this example. The precharge command (PRE) controls when the WL returns to the wordline low potential and the equalization (or precharge) of the bitlines ready for the next sensing operation. (During normal operation this command is supplied externally, however, during refresh it is provided internally.) The time between two ACT commands is referred to as $t_{RC}$ during normal operation and during a refresh it is called $t_{RFC}$. A wordline cycle ($t_{RC}$ or $t_{RFC}$) is made up of two components, $t_{RAS}$ and $t_{RP}$. $t_{RAS}$ is the time required to open the wordline, transfer the signal from the memory cell to the bitline, and for the sense amplifier to develop a full signal on the bitlines. $t_{RP}$ is the time required to equalize, or precharge the bitlines, and restore them to the mid-level voltage potential $V_{BLEQ}$ so they are ready to begin a new sensing operation. A simplified example of precharge circuitry is shown as block 22 in FIG. 2.

In the normal read and write operations of random access memory, the next memory cell, and hence wordline to be activated, is not known. Therefore, the memory controller must wait for the $t_{RP}$ (precharge) interval to be completed before issuing the next activate command. This is because the next memory cell to be accessed could share the same bitline, or share the same sense amplifier, as the previously accessed memory cell. The precharge interval is therefore required to ensure that the bitlines are restored to the mid-level signal $V_{BLEQ}$ so they are ready to begin a new sensing operation. Otherwise, data could be lost.

However, during an auto or self refresh operation, the memory addresses are generated internally on the DRAM device, and thus the sequence in which the cells are refreshed can be controlled. Because address generation for the refresh operation is deterministic, not random, the designer of the DRAM device can determine the exact sequence of wordlines to be activated during refresh. This may allow the DRAM designer to take advantage of the DRAM chip architecture to reduce the time spent refreshing the device. (This same concept can apply when the external memory controller addresses in a known sequence.)

Figure 4:
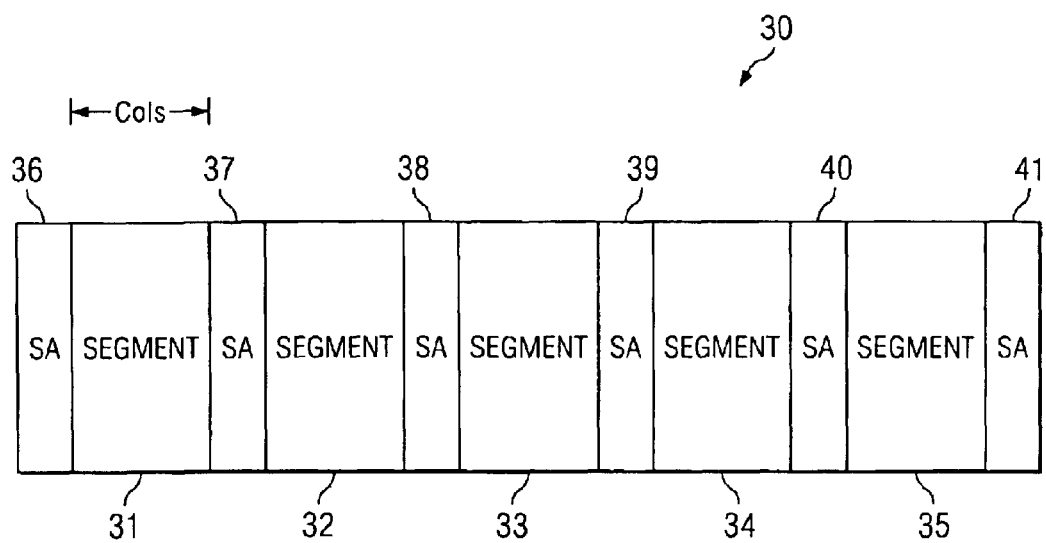
FIG. 4 illustrates a possible layout of an array portion of a DRAM device.

This point is illustrated with reference to FIGS. 4 and 5. FIG. 4 represents the layout, or arrangement of circuitry for a portion of a DRAM chip 30. Located on 30 are a plurality of memory cells arranged in segments, 31, 32, 33, 34 and 35. Also shown are columns of sense amplifiers 36, 37, 38, 39, 40 and 41. FIG. 4 is a simplified diagram intended to illustrate a preferred location and layout of circuitry on a portion of a DRAM chip, therefore interconnection lines and other circuitry normally required for a practical DRAM device are not shown.

Figure 5:
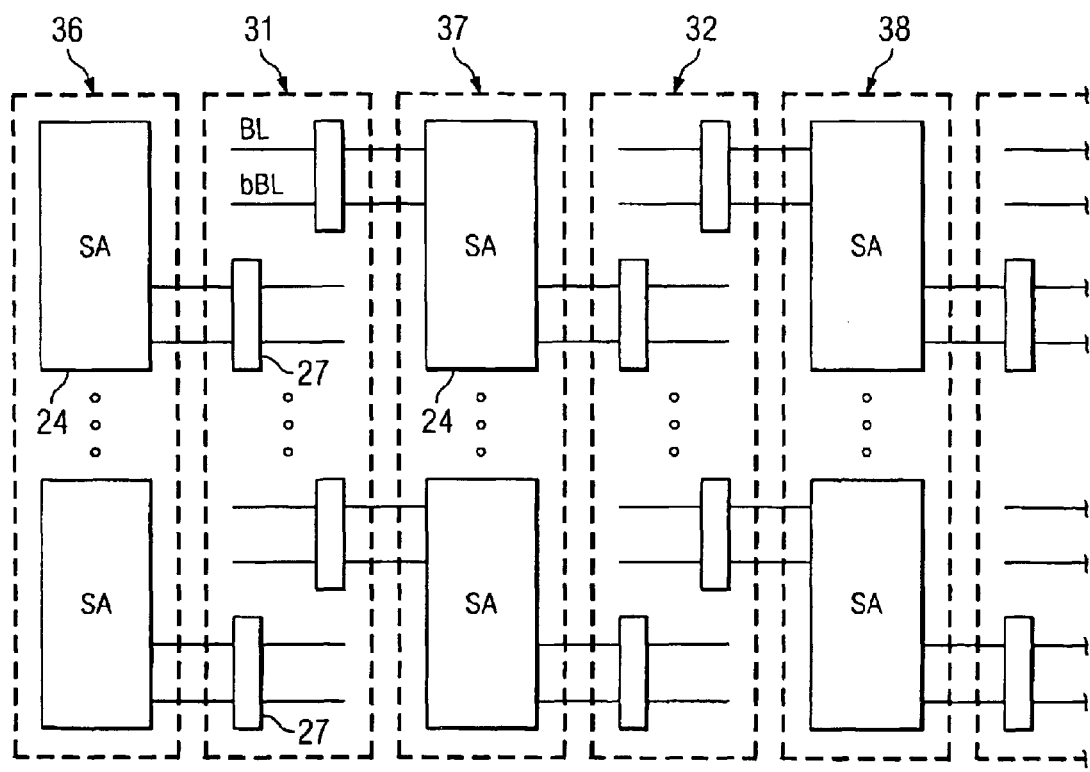
FIG. 5 illustrates a block diagram of an array portion of a DRAM device.

Illustrated in FIG. 5 is a slightly more detailed portion of FIG. 4. Shown are the banks of sense amplifiers 36, 37 and 38, along with memory array segments 31 and 32. The individual memory cells have been omitted for clarity (see FIG. 2). Within array segment 31 and 32 are shown some of the many bitline pairs (BL and bBL), along with pass transistors 27 which isolate the bitline pairs from the sense amplifiers. It is apparent that the sense amplifiers 24 from column 37, for example, may be shared between the bitlines of segments 31 and 32, thus reducing the number of sense amplifiers required for the DRAM device.

The time required to perform a refresh sequence could be advantageously reduced by ensuring that the bitlines of the memory cells refreshed in consecutive refresh cycles do not share sense amplifiers. The reduction in refresh time can be achieved because the refresh controller would not have to wait for completion of the precharge time interval $t_{RP}$ before beginning the next refresh cycle in sequence. Since the sense amplifiers are not shared in consecutive refresh cycles, the precharge interval of the prior refresh cycle can continue in the background, as it does not affect the sense amplifier for the current refresh cycle. Because the default state for a bitline pair is the precharged state, the bitlines for the next refresh cycle would already be precharged. For example, with reference to FIG. 4, the segments of DRAM chip portion 30 could be refreshed in the sequence shown in Table 1.

TABLE 1

| Refresh time | t1 | t2 | t3 | t4 | t5 | t6 | t7 |
|---|---|---|---|---|---|---|---|
| Segment Refreshed | 32 | 34 | 31 | 33 | 35 | 32 | repeat from t2 |

Table 2 provides a similar refresh sequence for a sixteen block array. In this example, the array is made up of sixteen segments that share sense amplifiers between them. Usually two wordlines are activated simultaneously, one in one of blocks 1–8 and one in blocks 9–16. Blocks 1–8 are equivalent to blocks 9–16 and blocks 8 and 9 are adjacent and share sense amplifiers. Table 2 shows the three addresses used to count the segments (AR), the block number and the proposed activation sequence (i.e., A then B then C, etc.). The proposed activation sequence ensures that no two adjacent segments are activated after each other. The sense amplifiers 37 (see element 24 in FIG. 2) should be completely separate because the isolators (27 in FIG. 2) could disconnect it, but it may not have had chance to equilibrate.

TABLE 2

| Block | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| AR <n + 2> | 0 | 0 | 0 | 0 | 1 | 1 | 1 | 1 | 0 | 0 | 0 | 0 | 1 | 1 | 1 | 1 |
| AR <n + 1> | 0 | 0 | 1 | 1 | 0 | 0 | 1 | 1 | 0 | 0 | 1 | 1 | 0 | 0 | 1 | 1 |
| AR <n> | 0 | 1 | 0 | 1 | 0 | 1 | 0 | 1 | 0 | 1 | 0 | 1 | 0 | 1 | 0 | 1 |
| Order | A | E | B | F | H | D | G | C | A | E | B | F | H | D | G | C |

Figure 6A:
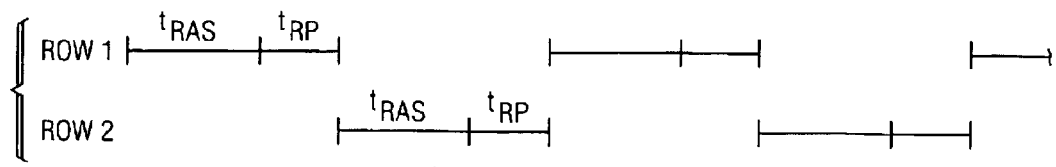
FIGS. 6a and 6b show a timing sequence for a prior art refresh cycle and a timing sequence for a refresh cycle according to the principles of the present invention.
Figure 6B:
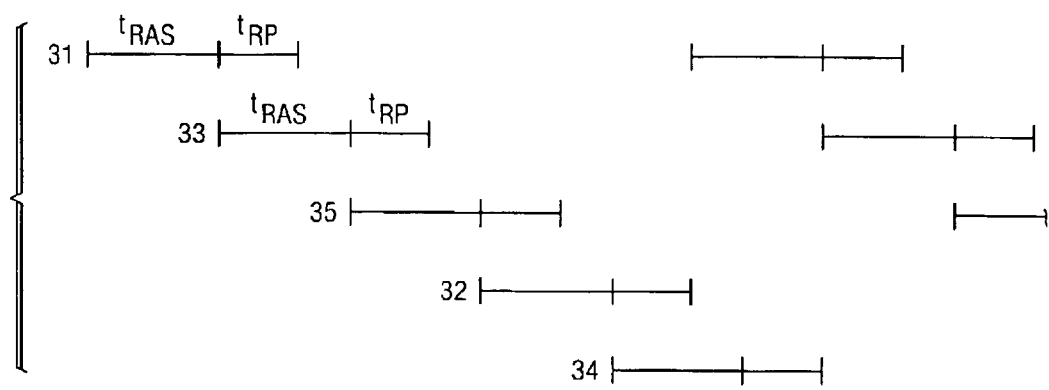

Illustrated in FIGS. 6a and 6b are exemplary refresh sequences of the prior art and of a preferred embodiment. FIG. 6a shows a refresh sequence, including time intervals $t_{RAS}$ and $t_{RP}$, for exemplary rows 1 and 2. The refresh of only 2 rows is shown for simplicity. In the prior art sequence of FIG. 6a, the activation of the next refresh cycle waits for completion of the precharge interval of the prior refresh cycle.

FIG. 6b shows a refresh sequence of a preferred embodiment of the present invention, wherein the illustrated refresh sequence was previously described in Table 1. In the illustrated embodiment, the refresh cycle for segment 34 may overlap all or part of the precharge interval for segment 32. The amount of overlap is chosen as a design parameter, and even a small amount of overlap would prove advantageous to reducing the overall refresh time. By beginning the next refresh cycle concurrent with the precharge interval of the prior refresh cycle, the overall refresh time of the DRAM device may be reduced.

A DRAM device may take advantage of the present invention by performing at least two refresh cycles in sequence. If at least two refresh cycles are performed in sequence, the second cycle may overlap in time a portion of the first refresh cycle, thus reducing the time required to refresh the device. Of course, more time could be saved by performing a plurality of refresh cycles in sequence. The maximum benefit is obtained using burst refresh mode.

In a preferred embodiment of the present invention, an address counter in a refresh controller 19 (FIG. 1) may be configured as a state machine to automatically generate the proper refresh address sequence. In another preferred embodiment, decoding logic may be located between an address counter and the row decoder 18 to automatically map the output of an address counter to the proper refresh address sequence. In yet another preferred embodiment, the row decoder 18 could be configured to input the address counter signal and automatically select the proper refresh address sequence. The preferred embodiments described herein are provided for the purpose of illustration and not limitation. It is readily understood that there are a variety of methods for a memory refresh controller to determine a refresh sequence in accordance with the principles of the present invention. It is also understood that there may be many possible refresh sequences in a practical DRAM device which comply with the principles of the present invention.

In a typical DRAM device, a plurality of memory cells are refreshed simultaneously in order to speed up the refresh process. For example, all of the cells connected to one or more wordlines may be refreshed simultaneously. One of the limiting factors that determines the number of cells that can be simultaneously refreshed is the current surge that occurs as a wordline is activated. In a practical device, each of the wordlines will exhibit a parasitic capacitance, including the space charge layer capacitance of the NMOS gates and capacitance associated with the interconnect metallization. As the wordline is activated, this parasitic capacitance must be charged up, and this charging draws a current from the devices' source power supply.

The magnitude of this current surge is proportional to the value of the parasitic capacitance, the speed at which a wordline is activated, and the number of wordlines that are simultaneously activated. (It is understood that simultaneous here means substantially simultaneous. In any practical device there will exist slight variations in activation times caused by normal layout and process variations.) An additional contribution to the current surge is the charge required to amplify the signals on all of the bitlines of each wordline as it is activated. If this current surge is too large, it can cause a transient on the power supply voltage, possibly causing a malfunction in other devices connected to the same power supply, or possibly a malfunction in the DRAM device itself. The peak current drawn from the power supply places a limit on the number of memory cells that can be refreshed simultaneously, as the value of the parasitic capacitance increases with the number of wordlines activated.

Figure 7:
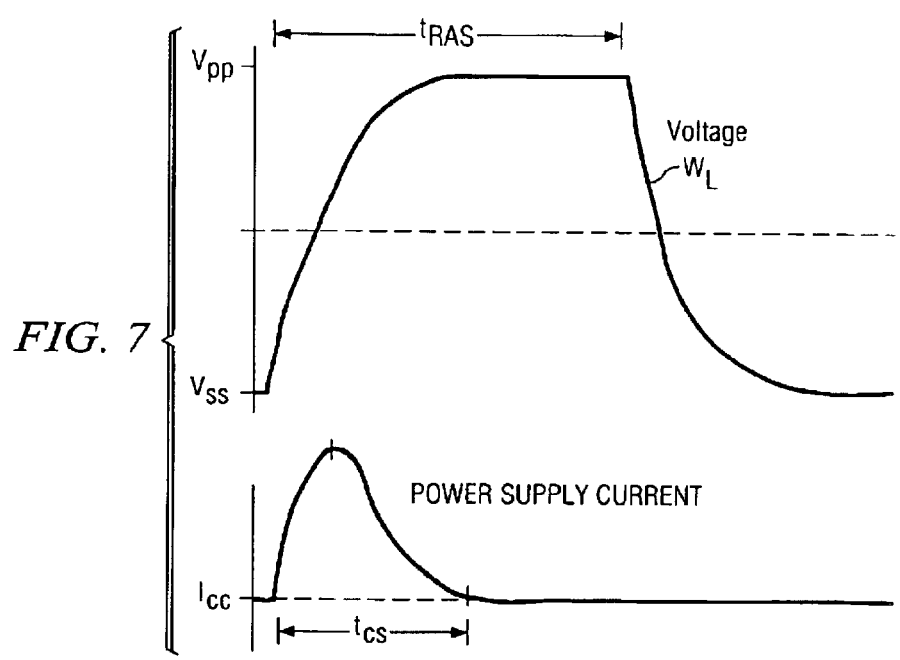
FIG. 7 shows exemplary voltage and current waveforms of a DRAM device.

According to the principles of the present invention, the total refresh time could be further reduced by overlapping the $t_{RAS}$ intervals of sequential refresh cycles. This is explained with reference to FIG. 7 and FIG. 8. A typical voltage waveform for a wordline activation and the current drawn from the power supply is shown in FIG. 7. As the wordline is activated, the parasitic capacitance will charge through the parasitic resistance of the activation circuit, resulting in a familiar RC time constant. (It is understood that there are many parasitic circuit components, including interconnection inductances, and lumped and distributed resistance and capacitance components. For the purposes of illustration, the wordline activation circuit is assumed to be a simple RC circuit. This simplification does not substantially alter the principles discussed here.) The magnitude of the current surge is proportional to the rate of change of the wordline activation voltage. Therefore, the current surge time interval $t_{CS}$ typically exists for only a fraction of the $t_{RAS}$ time interval. As more wordlines are activated simultaneously, the current surges due to individual wordlines will add together, and the overall power supply current surge will increase.

Figure 8:
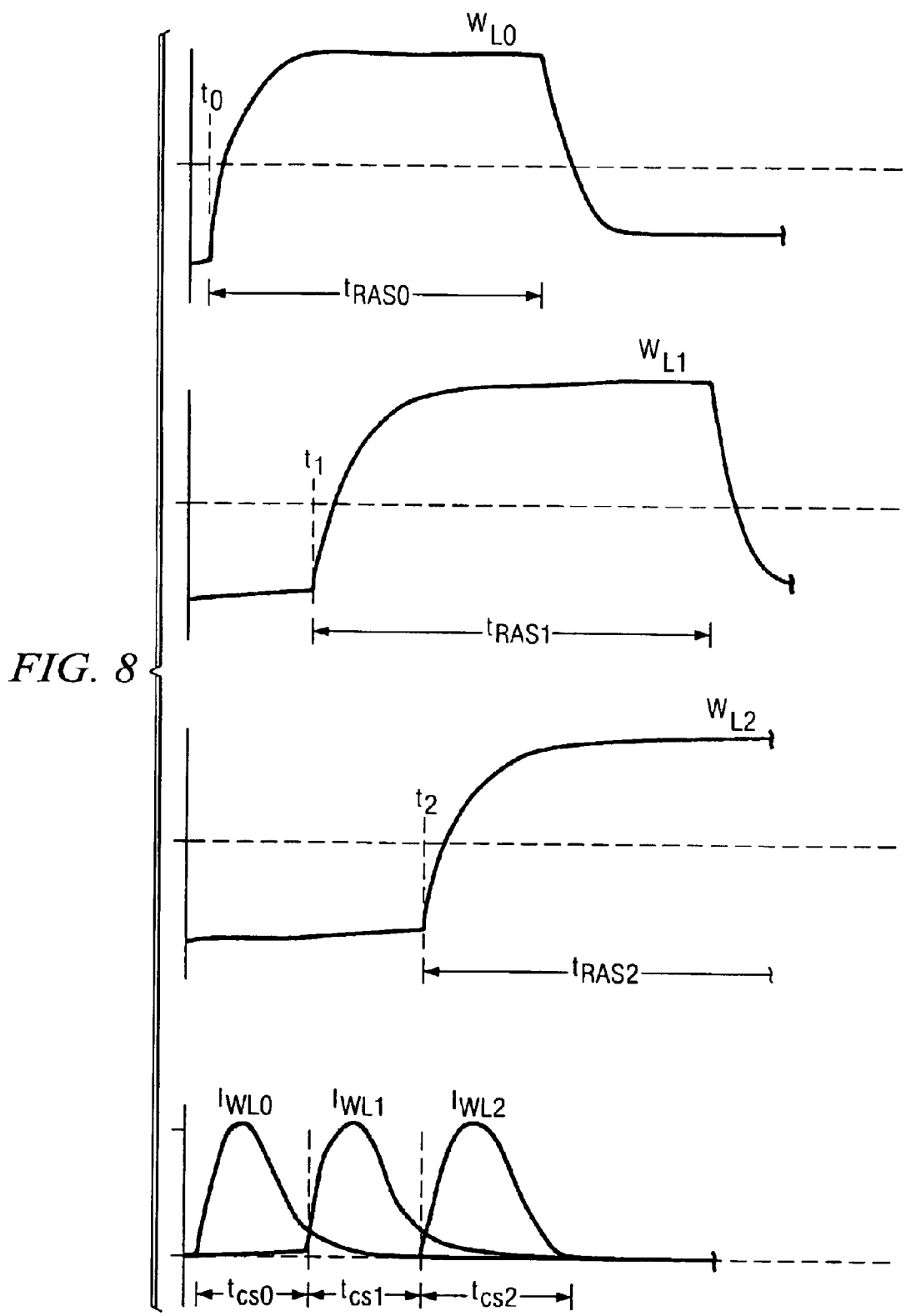
FIG. 8 shows exemplary voltage and current waveforms of a DRAM device according to the principles of the present invention.

FIG. 8 illustrates a method to further reduce the refresh time in accordance with the principles of the present invention. It may not be necessary to wait for the end of the $t_{RAS}$ interval of a prior refresh cycle to begin the next refresh cycle. Because the current surge interval $t_{CS}$ typically lasts for only a fraction of the $t_{RAS}$ time interval, the $t_{RAS}$ intervals of sequential refresh cycles could overlap as long as the activations are staggered in time long enough to limit the overall peak surge current. In FIG. 8, wordline 1 ($WL_1$) is activated at time $t_1$, which overlaps the $t_{RAS}$ interval of $WL_0$. In order to limit the peak surge current, $t_1$ should be delayed from $t_0$ long enough to ensure that the surge currents ($I_{WL0}$ and $I_{WL1}$) do not overlap to an extent such that their sum would exceed the maximum allowable current surge. The amount of overlap that could be tolerated is determined in part by various manufacturing process parameters, including those that control the value of the parasitic components and the rise time of the wordline signals and also by the maximum allowable power consumption.

Delay of sequential wordline activations such that the $t_{RAS}$ intervals overlap may be controlled by a variety of means, including but not limited to the following examples. The memory refresh controller could make use of a high frequency clock having a plurality of edge transitions within a single refresh cycle. This higher frequency clock would increase the granularity with which sequential activations could be controlled. The memory controller could be configured to choose the appropriate clock edge to activate the next wordline(s) in the refresh sequence, thus reducing the refresh time while maintaining peak power supply current within design limits. The wordline charging time constant may vary with, for example, temperature or manufacturing process variations. The memory controller could be programmed to use a certain clock edge during the manufacturing of the device in order to compensate for device variations. Also, memory controller could be configured to adaptively select the appropriate clock edge automatically as a function of device temperature, for example. Alternatively, one or more delay lines could be selectively applied to the activation circuitry in order to control the activation delay. The delay lines could be configured during the manufacturing of the device in order to compensate for device variations.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of refreshing memory cells in a memory array, the method comprising:

receiving an indication that the memory array is to perform a refresh operation, wherein the refresh operation comprises at least two refresh cycles, each refresh cycle having an activation interval followed by a precharge interval;

initiating a first refresh cycle by activating a first wordline coupled to a first group of memory cells, each memory cell in the first group of memory cells in electrical communication with a sense amplifier in a first group of sense amplifiers;

initiating a second refresh cycle by activating a second wordline coupled to a second group of memory cells, each memory cell in the second group of memory cells in electrical communication with a sense amplifier in a second group of sense amplifiers where no sense amplifier in the first group is in the second group and no sense amplifier in the second group is in the first group, and wherein the second refresh cycle is initiated at least a current surge time after the initiation of the first refresh cycle but prior to the completion of the first refresh cycle.

2. The method of claim 1 wherein the second refresh cycle is initiated during the precharge interval of the first refresh cycle.

3. The method of claim 1 wherein the second refresh cycle is initiated during the activation interval of the first refresh cycle.

4. The method of claim 1 and further comprising selectively generating first and second row addresses to activate the first and second wordlines such that each sense amplifier in the second group of sense amplifiers is electrically isolated from each memory cell in the first group of memory cells.

5. The method of claim 4 wherein a refresh controller selectively generates,the first and second row addresses.

6. The method of claim 4 wherein an address generator selectively generates the first and second row addresses.

7. The method of claim 4 wherein a row decoder accepts an input signal from an address counter and selectively generates the first and second row addresses.

8. The method of claim 1 and further comprising initiating the first refresh cycle by activating a first plurality of wordlines controlling the first group of memory cells, the plurality of wordlines coupled to a plurality of rows to be simultaneously refreshed.

9. The method of claim 8 and further comprising initiating the second refresh cycle by activating a second plurality of wordlines controlling the second group of memory cells, each memory cell in the second group of memory cells in electrical communication with a sense amplifier electrically isolated from each memory cell in the first group of memory cells.

10. The method of claim 1 wherein receiving an indication comprises receiving an indication to refresh a plurality of rows of memory cells, the plurality of rows of memory cells being fewer than all of the rows of memory cells.

11. The method of claim 10 wherein receiving an indication comprises receiving an indication to refresh a plurality of rows of memory cells, the plurality of rows of memory cells being at least four rows but no more than sixteen rows.

12. The method of claim 1 wherein receiving an indication comprises receiving an indication to refresh every memory cell in the memory array.

13. A dynamic random access memory array comprising:

a plurality of blocks of memory cells, each block including a plurality of rows and columns of memory cells;

a plurality of banks of sense amplifiers wherein each bank of sense amplifiers is located between adjacent blocks of memory cells such that each sense amplifier is coupled to columns of memory cells in two adjacent blocks;

a row decoder coupled to each of the blocks of memory cells, the row decoder having a plurality of control outputs, each of the control outputs coupled to a row of memory cells; and a refresh controller adapted to generate a row address sequence for a plurality of refresh cycles, each of the refresh cycles having an activation interval followed by a precharge interval, wherein a first refresh cycle of a row in a first one of the blocks is followed by a second refresh cycle in a row in a second one of the blocks, the first block not being adjacent to the second block, wherein the refresh controller causes the second refresh cycle to be initiated at least a surge time after the initiation but prior to the completion of the first refresh cycle.

14. The memory device of claim 13 wherein the refresh controller causes the second refresh cycle to be initiated during the precharge interval of the first refresh cycle.

15. The memory device of claim 13 wherein the refresh controller causes the second refresh cycle to be initiated during the activation interval of the first refresh cycle.

16. A method of refreshing a dynamic random access memory array that includes a plurality of blocks with rows and columns of memory cells and a plurality of banks of sense amplifiers wherein each bank of sense amplifiers is shared between adjacent blocks of memory cells such that each sense amplifier is coupled to columns of memory cells in two adjacent blocks, the method comprising:

receiving an indication that the memory array is to perform a self refresh operation, wherein the refresh operation comprises a plurality refresh cycles to sequentially refresh all rows in the array, each refresh cycle having an activation interval followed by a precharge interval; and sequentially initiating each of the plurality of refresh cycles by:
 (a) activating a wordline coupled to a row of memory cells in a first one of the banks;
 (b) after waiting a period of time less than a refresh cycle time but not less than a current surge time, activating a wordline coupled to a row of memory cells in a second one of the banks, the second one of the banks not sharing a sense amplifier the first one of the banks; and (c) repeating step (b) until each row of memory cells in the array has been refreshed.

17. The method of claim 16 wherein the second refresh cycle is initiated during the precharge interval of the first refresh cycle.

18. The method of claim 16 wherein the second refresh cycle is initiated during the activation interval of the first refresh cycle.

19. The method of claim 16 wherein (a) activating a wordline comprises simultaneously activating a plurality of wordlines.

20. The method of claim 19 wherein the, number of wordlines in the plurality of wordlines is determined by an amount of current drawn by the memory array during a refresh cycle of a single row.

21. A dynamic random access memory array comprising:
 a plurality of blocks of memory cells, each block including a plurality of rows and columns of memory cells;
 a plurality of banks of sense amplifiers wherein each bank of sense amplifiers is located between adjacent ones of the blocks of memory cells such that each sense amplifier is coupled to columns of memory cells in two adjacent blocks;
 means for receiving an indication that the memory array is to perform a refresh operation, wherein the refresh operation comprises at least two refresh cycles, each refresh cycle having an activation interval followed by a precharge interval; and
 means for initiating a first refresh cycle of a row in a first one of the blocks followed by a second refresh cycle in a row in a second one of the blocks, the first block not being adjacent to the second block, wherein means for initiating causes the second refresh cycle to be initiated after the initiation of but prior to the completion of the first refresh cycle.

22. The memory array of claim 21 wherein the means for initiating causes the second refresh cycle to be initiated during the precharge interval of the first refresh cycle.

23. The memory array of claim 21 wherein the means for initiating causes the second refresh cycle to be initiated during the activation interval of the first refresh cycle.

* * * * *